(12) United States Patent
Wu et al.

(10) Patent No.: US 11,545,571 B2
(45) Date of Patent: Jan. 3, 2023

(54) SEMICONDUCTOR DEVICE AND MANUFACTURING METHOD THEREOF

(71) Applicant: NANYA TECHNOLOGY CORPORATION, New Taipei (TW)

(72) Inventors: Pei-Jhen Wu, Taipei (TW); Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 65 days.

(21) Appl. No.: 17/230,951

(22) Filed: Apr. 14, 2021

(65) Prior Publication Data
US 2022/0336660 A1  Oct. 20, 2022

(51) Int. Cl.
*H01L 29/78* (2006.01)
*H01L 29/423* (2006.01)
*H01L 29/66* (2006.01)

(52) U.S. Cl.
CPC ...... *H01L 29/7827* (2013.01); *H01L 29/4232* (2013.01); *H01L 29/66666* (2013.01)

(58) Field of Classification Search
CPC ............. H01L 29/7827; H01L 29/4232; H01L 29/66666

USPC ......................................................... 257/329
See application file for complete search history.

(56) References Cited

U.S. PATENT DOCUMENTS

| | | | |
|---|---|---|---|
| 9,773,913 B1* | 9/2017 | Balakrishnan | H01L 21/28518 |
| 9,899,515 B1* | 2/2018 | Cheng | H01L 29/0847 |
| 10,229,986 B1* | 3/2019 | Jagannathan | H01L 29/66666 |
| 2019/0386136 A1* | 12/2019 | Kwon | H01L 21/823418 |
| 2020/0058767 A1* | 2/2020 | Cheng | H01L 29/0847 |
| 2020/0343241 A1* | 10/2020 | Wu | H01L 21/823487 |

\* cited by examiner

*Primary Examiner* — Mohammad M Hoque
(74) *Attorney, Agent, or Firm* — CKC & Partners Co., LLC

(57) ABSTRACT

The semiconductor device includes a first source/drain layer, a dielectric layer, a channel, a gate electrode, a first gate dielectric layer, a seed layer, a conductive layer, and a second source/drain layer. The dielectric layer is disposed on the first source/drain layer, in which the dielectric layer has a hole penetrating the dielectric layer. The channel is disposed in the hole and extends substantially perpendicular to an upper surface of the first source/drain layer. The gate electrode surrounds the channel. The first gate dielectric layer is disposed between the gate electrode and the channel. The seed layer is disposed between the gate electrode and the dielectric layer and on an upper surface of the dielectric layer, in which the seed layer covers a portion of a sidewall of the hole.

11 Claims, 16 Drawing Sheets

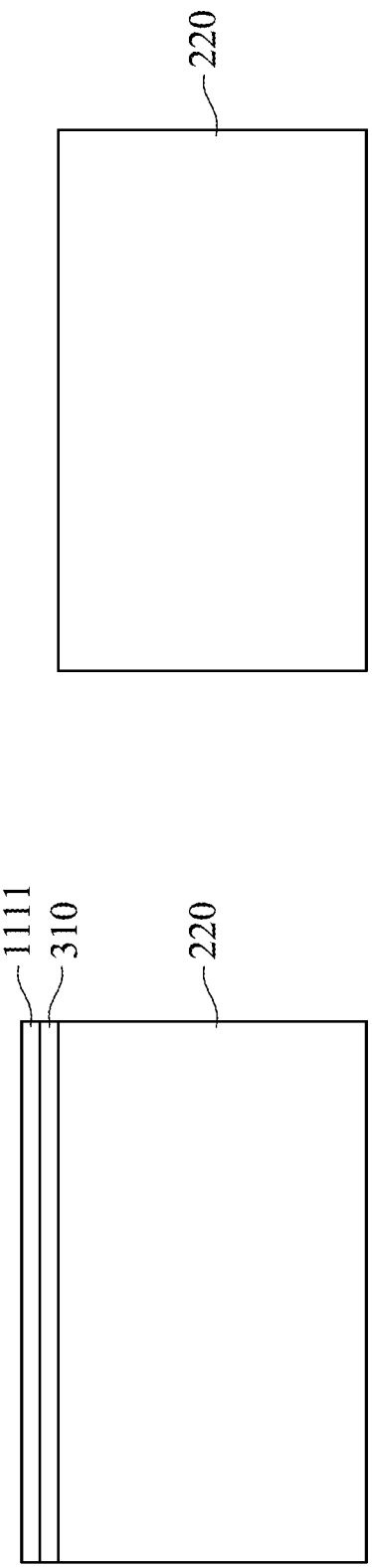

SEMICONDUCTOR DEVICE AND MANUFACTURING METHOD THEREOF

BACKGROUND

Field of Invention

The present disclosure relates to a semiconductor device and a manufacturing method of a semiconductor device.

Description of Related Art

Accompanying with the development of semiconductor devices such as computers and smart phones, techniques of random access memory (RAM) are highly demanded. A RAM device is a type of computer memory that can read and store data within an integrated circuit (IC) chip. In general, transistors and capacitors are arranged in a form of a matrix in the RAM device to form a memory array. A vertical transistor has been developed to satisfy the shrinking dimension of the IC chip. However, the manufacturing method of a RAM includes multiple photolithography process, and the word line spacing of vertical transistors continue to shrink. Therefore, an alignment problem may be occurred in the manufacturing method. Accordingly, there is a demand for a novel structure and manufacturing method thereof to satisfy the reliability of semiconductor devices.

SUMMARY

One aspect of the present disclosure is to provide a semiconductor device. The semiconductor device includes a first source/drain layer, a dielectric layer, a channel, a gate electrode, a first gate dielectric layer, a seed layer, a conductive layer, and a second source/drain layer. The dielectric layer is disposed on the first source/drain layer, in which the dielectric layer has a hole penetrating the dielectric layer. The channel is disposed in the hole and extends substantially perpendicular to an upper surface of the first source/drain layer. The gate electrode surrounds the channel. The first gate dielectric layer is disposed between the gate electrode and the channel. The seed layer is disposed between the gate electrode and the dielectric layer and on an upper surface of the dielectric layer, in which the seed layer covers a portion of a sidewall of the hole. The conductive layer is disposed between the gate electrode and the first gate dielectric layer, and on an upper surface of the gate electrode and the seed layer. The second source/drain layer is disposed on the channel.

According to some embodiments of the present disclosure, a lower surface of the gate electrode is substantially coplanar with a lower surface of the seed layer.

According to some embodiments of the present disclosure, a lower surface of the gate electrode is substantially coplanar with a lower surface of the conductive layer.

According to some embodiments of the present disclosure, a material of the gate electrode is the same as a material of the conductive layer.

According to some embodiments of the present disclosure, a material of the gate electrode is different from a material of the seed layer.

According to some embodiments of the present disclosure, a material of the conductive layer is different from a material of the seed layer.

According to some embodiments of the present disclosure, the semiconductor device further includes a second gate dielectric layer disposed between the gate electrode and the first source/drain layer, in which a first thickness of the second gate dielectric layer is smaller than a second thickness of the gate electrode.

According to some embodiments of the present disclosure, the dielectric layer has a first thickness, the gate electrode has a second thickness, and a ratio of the first thickness to the second thickness is in a range between 5:2 and 5:4.

According to some embodiments of the present disclosure, the semiconductor device further includes a third gate dielectric layer disposed between the second source/drain layer and the conductive layer, and between the first gate dielectric layer and the conductive layer.

According to some embodiments of the present disclosure, a first thickness of the channel is greater than a second thickness of the dielectric layer.

According to some embodiments of the present disclosure, the gate electrode has a first thickness, and a vertical distance between the upper surface of the gate electrode and the upper surface of the dielectric layer is smaller than the first thickness.

One aspect of the present disclosure is to provide a manufacturing method of a semiconductor device. The manufacturing method includes the following operations. A first source/drain layer is provided. A dielectric layer is formed on the first source/drain layer, in which the dielectric layer has a first hole to expose the first source/drain layer. A seed layer is formed to cover an upper surface of the first source/drain layer, a sidewall of the first hole, and an upper surface of the dielectric layer and to form a second hole. A patterned gate electrode is formed to cover a middle portion of the seed layer disposed on the sidewall of the first hole. A portion of the seed layer below the patterned gate electrode is removed to form a patterned seed layer and expose the first source/drain layer and the dielectric layer. A conductive layer is formed to cover a sidewall and an upper surface of the patterned gate electrode and the patterned seed layer and to form a third hole. A first gate dielectric layer is filled into the third hole. A portion of the first gate dielectric layer is etched to form a fourth hole to expose the first source/drain layer and a portion of the conductive layer, in which the fourth hole is substantially perpendicular to an upper surface of the first source/drain layer. A second gate dielectric layer is formed to cover a sidewall of the fourth hole and to form a fifth hole. A channel is formed in the fifth hole. A second source/drain layer is formed on the channel.

According to some embodiments of the present disclosure, the patterned gate electrode is formed by a plating deposition.

According to some embodiments of the present disclosure, the conductive layer is formed by a plating deposition.

According to some embodiments of the present disclosure, in the step of forming the patterned gate electrode covering a middle portion of the seed layer disposed on the sidewall of the first hole includes the following operations. A photoresist layer is formed on the seed layer, in which the seed layer above the photoresist layer is exposed from the second hole. A gate electrode is formed on the photoresist layer, in which the seed layer above the gate electrode is exposed from the second hole. A portion of the gate electrode is etched to expose the photoresist layer and to form the patterned gate electrode. The photoresist layer is removed.

According to some embodiments of the present disclosure, the photoresist layer is removed by a wet etching process.

According to some embodiments of the present disclosure, the manufacturing method further includes the following operations. After forming the gate electrode on the photoresist layer, a patterned hard mask layer is formed on the gate electrode and an upper surface of the seed layer, in which the portion of the gate electrode is exposed. After removing the portion of the seed layer below the patterned gate electrode, the patterned hard mask layer is removed to expose an upper surface of the patterned seed layer and the upper surface of the patterned gate electrode.

According to some embodiments of the present disclosure, the patterned hard mask layer is removed by a wet etching process.

According to some embodiments of the present disclosure, in the step of forming the second gate dielectric layer covering the sidewall of the fourth hole to form the fifth hole includes the following operations. The second gate dielectric layer is formed on the sidewall of the fourth hole, the upper surface of the first source/drain layer, and an upper surface of the first gate dielectric layer. An etch back operation is performed to expose the first source/drain layer and the upper surface of the first gate dielectric layer.

According to some embodiments of the present disclosure, removing the portion of the seed layer below the patterned gate electrode to form the patterned seed layer and expose the first source/drain layer and the dielectric layer is performed by a wet etching process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 to FIG. 19 and FIG. 22 to FIG. 24 are cross-sectional views schematically illustrating intermediate stages in the manufacturing of a semiconductor device in accordance with some embodiments of the present disclosure.

DETAILED DESCRIPTION

Figure 1:
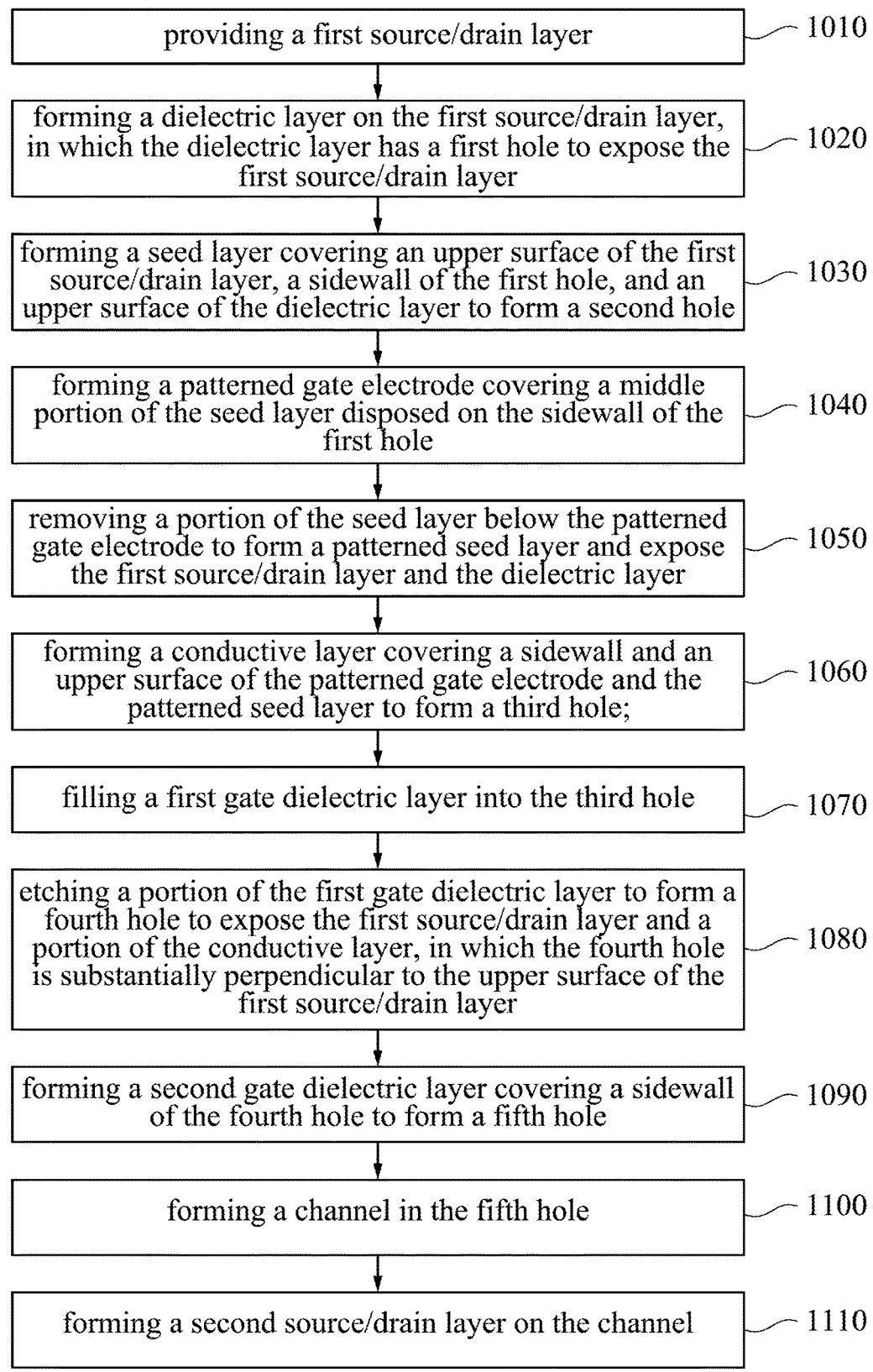
FIG. 1 is a flowchart of a manufacturing method of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A random access memory (RAM) device is formed by a memory array, and the memory array includes a gate electrode, a word line, and a bit line, in which the gate electrode is disposed below the word line. In general, the manufacturing method of a memory array is firstly forming the word line, followed by forming the gate electrode, and then forming the bit line. However, the operation of forming the word line includes at least one photolithography process, and the operation of forming the gate electrode also includes at least one photolithography process. Therefore, alignment problems in those photolithography processes may be occurred. A solution of the alignment problem is to remain larger space between two word lines, but this would have a negative effect on forming a RAM with a smaller pitch. In addition, if the gate electrode is not aligned with the word line properly, short circuits may occur. The present disclosure of a manufacturing method of a semiconductor device is firstly forming the gate electrode, followed by forming the word line, and then forming the bit line. This method can reduce the number of times of photolithography process, thereby reducing the possibility of short circuits of the RAM and forming the RAM with a smaller pitch.

FIG. 1 is a flowchart of a manufacturing method 1000 of a semiconductor device 1900 in accordance with some embodiments of the present disclosure. Operation 1010 of the method is providing a first source/drain layer. Operation 1020, a dielectric layer is formed on the first source/drain layer, in which the dielectric layer has a first hole to expose the first source/drain layer. The operation 1020 continues with operation 1030 in which a seed layer is formed to cover an upper surface of the first source/drain layer, a sidewall of the first hole, and an upper surface of the dielectric layer and to form a second hole. Operation 1040, a patterned gate electrode is formed to cover a middle portion of the seed layer disposed on the sidewall of the first hole. The operation 1040 continues with operation 1050 in which a portion of the seed layer below the patterned gate electrode is removed to form a patterned seed layer and expose the first source/drain layer and the dielectric layer. Operation 1060, a conductive layer is formed to cover a sidewall and an upper surface of the patterned gate electrode and the patterned seed layer and to form a third hole. The operation 1060 continues with operation 1070 in which a first gate dielectric layer is filled into the third hole. Operation 1080, a portion of the first gate dielectric layer is etched to form a fourth hole to expose the first source/drain layer and a portion of the conductive layer, in which the fourth hole is substantially perpendicular to the upper surface of the first source/drain layer. The operation 1080 continues with operation 1090 in which a second gate dielectric layer is formed to cover a sidewall of the fourth hole and to form a fifth hole. Operation 1100, a channel is formed in the fifth hole. The operation 1100 continues with operation 1110 in which a second source/drain layer is formed on the channel.

It is understood that additional operations can be provided before, during, and after processes shown by FIG. 1, and some of the operations described below can be added, replaced or eliminated, for additional embodiments of the process. The order of the operations/processes may be interchangeable.

FIG. 2 to FIG. 19 are cross-sectional views of schematically illustrating intermediate stages in the manufacturing of the semiconductor device 1900 in accordance with some embodiments of the present disclosure.

Figure 2:
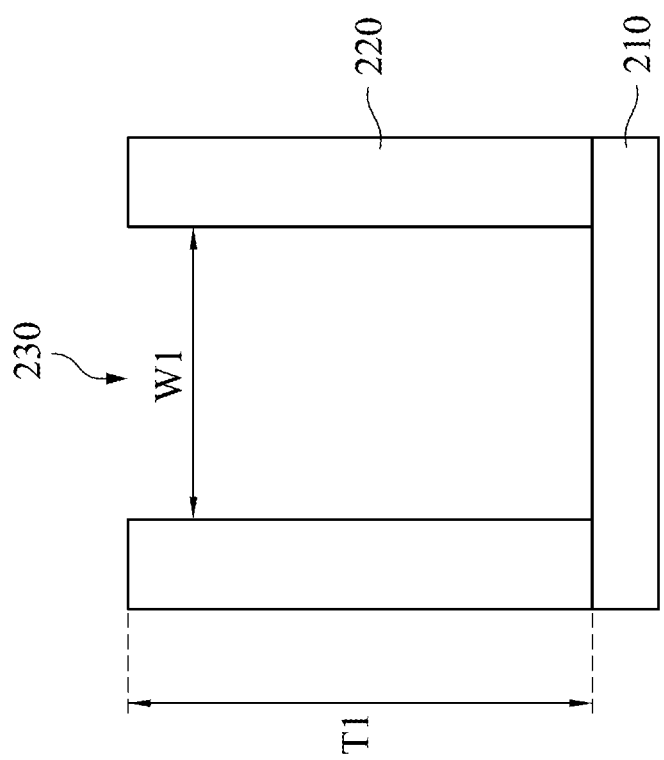

Please refer to FIG. 2, a source/drain layer 210 is provided, and a dielectric layer 220 is formed on the source/drain layer 210, in which the dielectric layer 220 has a hole 230 to expose the source/drain layer 210. In some embodiments, the source/drain layer 210 includes source/drain material such as indium tin oxide (ITO), indium zinc oxide (IZO) or indium gallium zinc oxide (IGZO), but not limited thereto. In some embodiments, the dielectric layer 220 includes dielectric material such as silicon oxide. In some embodiments, the dielectric layer 220 has a thickness T1, and the thickness T1 is in a range between about 80 nm and about 110 nm, for example, 85, 90, 95, 100, or 105 nm. In some embodiments, the hole 230 has a width W1, and the width W1 is in a range between about 40 nm and about 70 nm, for example, 45, 50, 55, 60, or 65 nm.

Figure 3:
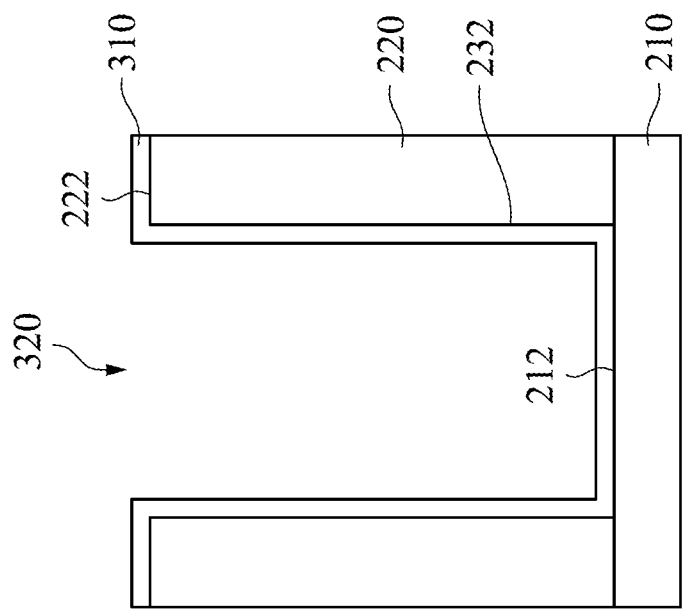

Please refer to FIG. 3, a seed layer 310 is formed to cover an upper surface 212 of the source/drain layer 210, a sidewall 232 of the hole 230, and an upper surface 222 of the dielectric layer 220 and to form a hole 320. It is understood that the seed layer 310 can also referred to as a glue layer. In some embodiments, the seed layer 310 includes conductive material, such as titanium (Ti), copper (Cu), tantalum (Ta), or combinations thereof, but not limited thereto. In some embodiments, the seed layer 310 is formed by a deposition method such as chemical vapor deposition (CVD), physical vapor deposition (PVD), atomic layer deposition (ALD), or other suitable deposition processes. It is noticed that the formation of the seed layer 310 would have a positive impact on the subsequent operations of the method 1000.

Figure 4:
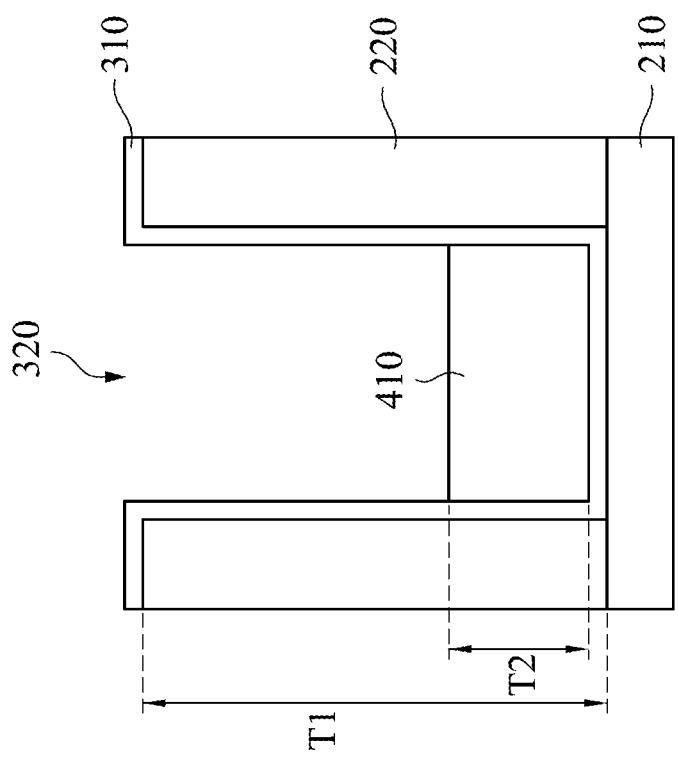

Please refer to FIG. 4, a photoresist layer 410 is formed on the seed layer 310, in which the seed layer 310 above the photoresist layer 410 is exposed from the hole 320. In some embodiments, the photoresist layer 410 is formed by any suitable photoresist material. The photoresist layer 410 has a thickness T2. In some embodiments, a ratio of the thickness T1 of the dielectric layer 220 to the thickness T2 of the photoresist layer 410 is in a range between about 5:0.5 and about 5:1.5, for example, 5:0.8, 5:1, 5:1.2, or 5:1.4.

Figure 5:
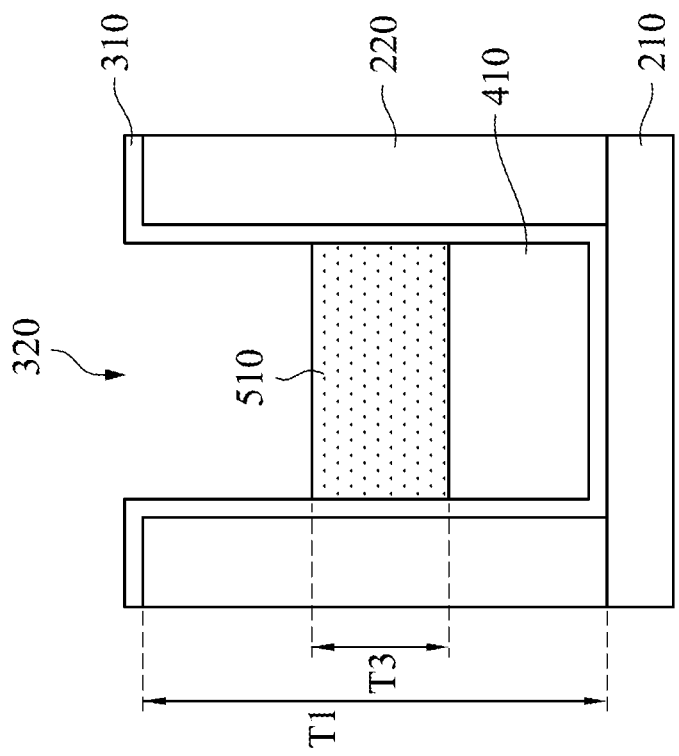

Please refer to FIG. 5, a gate electrode 510 is formed on the photoresist layer 410, in which the seed layer 310 above the gate electrode 510 is exposed from the hole 320. In some embodiments, the gate electrode 510 includes conductive material, such as tungsten (W), copper (Cu), or molybdenum (Mo), but not limited thereto. In some embodiments, the gate electrode 510 is formed by a plating deposition. The gate electrode 510 has a thickness T3, which can be adjusted by a plating time. In some embodiments, a ratio of the thickness T1 of the dielectric layer 220 to the thickness T3 of the gate electrode 510 is in a range between about 5:2 and about 5:4, for example, 5:2.5, 5:3, or 5:3.5. The thickness T3 is within a suitable interval, and therefore the gate electrode 510 can work well. It is noticed that the vertical position of the gate electrode 510 depends on the thickness T2 of the photoresist layer 410.

Figure 6:
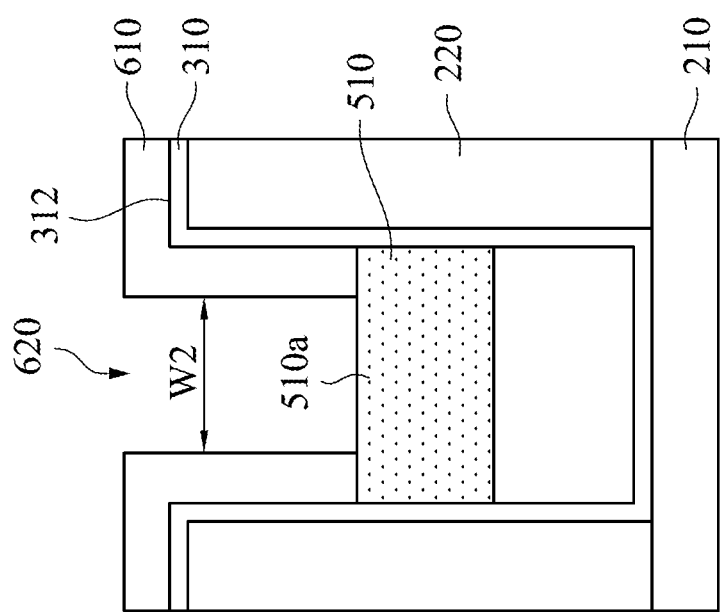

Please refer to FIG. 6, a patterned hard mask layer 610 is formed on the gate electrode 510 and an upper surface 312 of the seed layer 310 to form a hole 620, in which a portion 510a of the gate electrode 510 is exposed. In some embodiments, the hole 620 has a width W2, and the W2 is in a range between about 30 nm and about 50 nm, for example, 35, 40, or 45 nm, in which the width W1 as shown in FIG. 2 is greater than width W2. In some embodiments, the patterned hard mask layer 610 can be formed by any hard mask material such as nitride, but not limited thereto. In some embodiments, the patterned hard mask layer 610 is formed by atomic layer deposition (ALD), or other suitable deposition processes.

Figure 7:
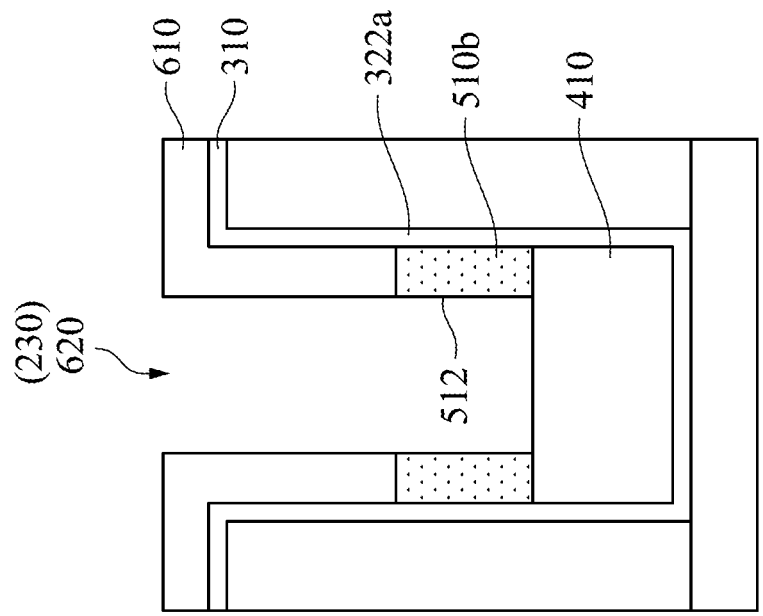
Figure 20:
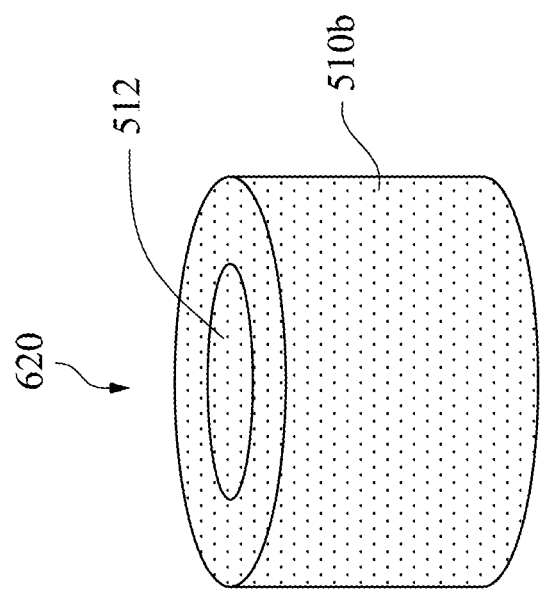
FIG. 20 is a stereogram of a patterned gate electrode of the semiconductor device in accordance with some embodiments of the present disclosure.

Please refer to FIG. 7, the portion 510a of the gate electrode 510 is etched to form a patterned gate electrode 510b. Specifically, the patterned gate electrode 510b covers a middle portion 322a of the seed layer 310 disposed on the sidewall of the hole 230. Please also refer to FIG. 20, FIG. 20 is a stereogram of the patterned gate electrode 510b. More specifically, the patterned gate electrode 510b has an annular shape. In some embodiments, the portion 510a of the gate electrode 510 is etched by a dry etching process.

Figure 8:
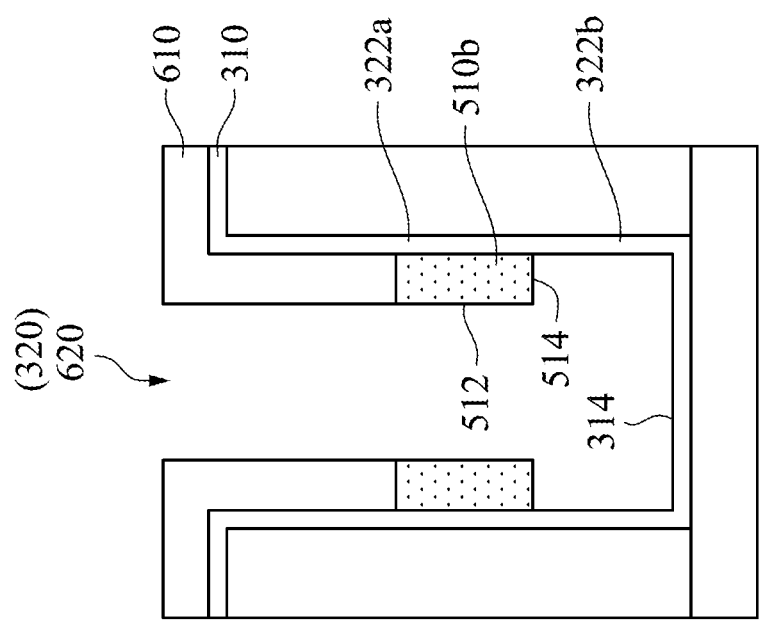

Please refer to FIG. 8, the photoresist layer 410 is removed. An upper surface 314 of the seed layer 310 in the hole 320 and a lower surface 514 of the patterned gate electrode 510b are exposed. In addition, a bottom portion 322b of the seed layer 310 is exposed. In some embodiments, the photoresist layer 410 is removed by a wet etching process.

Figure 9:
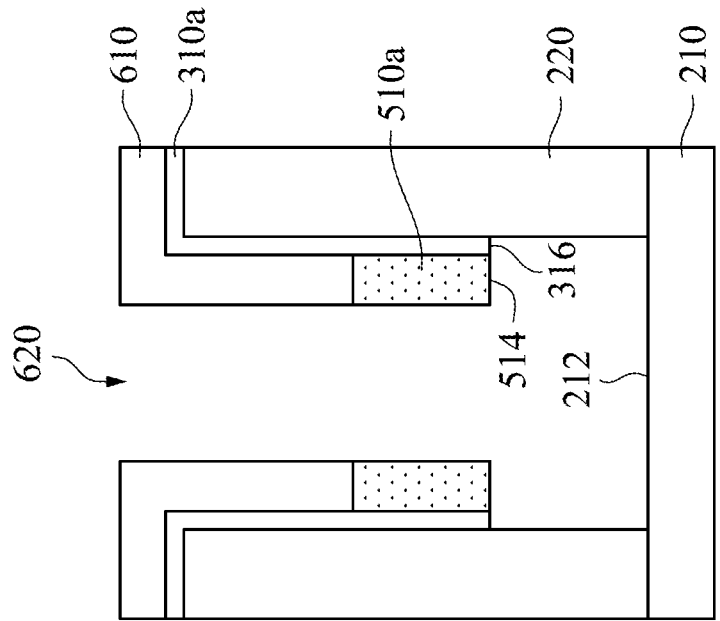

Please refer to FIG. 9, a portion of the seed layer 310 below the patterned gate electrode 510a is removed to form a patterned seed layer 310a and expose the source/drain layer 210 and the dielectric layer 220. Specifically, the upper surface 212 of the source/drain layer 210 and a bottom portion of the dielectric layer 220 are exposed. More specifically, a lower surface 316 of the patterned seed layer 310a is exposed. In some embodiments, the lower surface 514 of the patterned gate electrode 510b is substantially coplanar with the lower surface 316 of the patterned seed layer 310a. In some embodiments, the portion of the seed layer 310 is removed by a wet etching process.

Figure 10:
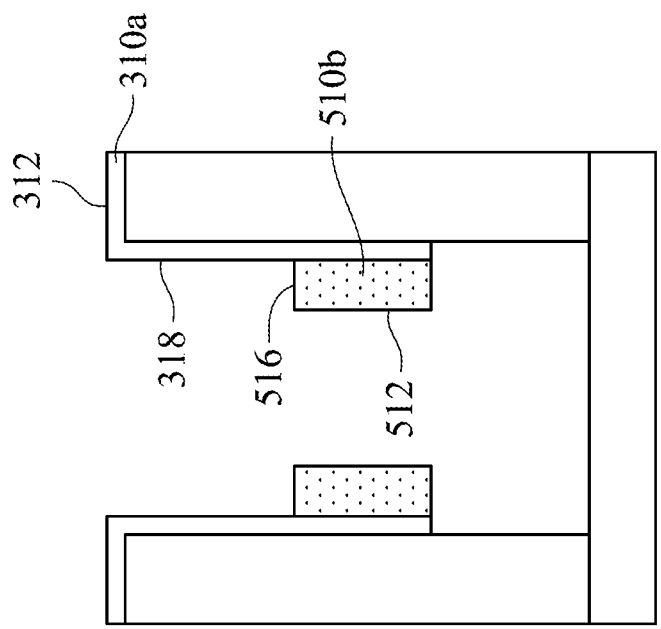

Please refer to FIG. 10, the patterned hard mask layer 610 is removed to expose the upper surface 312 of the patterned seed layer 310a and an upper surface 516 of the patterned gate electrode 510a. Specifically, a sidewall 318 of the patterned seed layer 310a is also exposed. In some embodiments, the patterned hard mask layer 610 is removed by a wet etching process.

Figure 11:
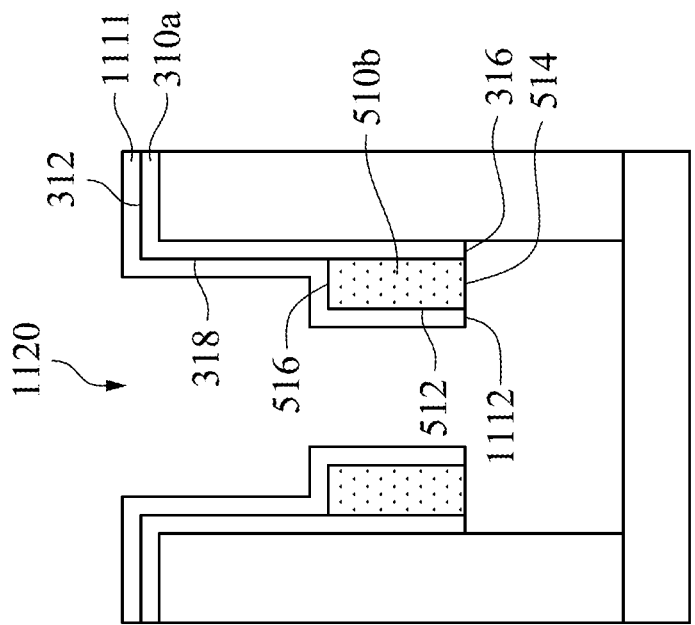
Figure 25:
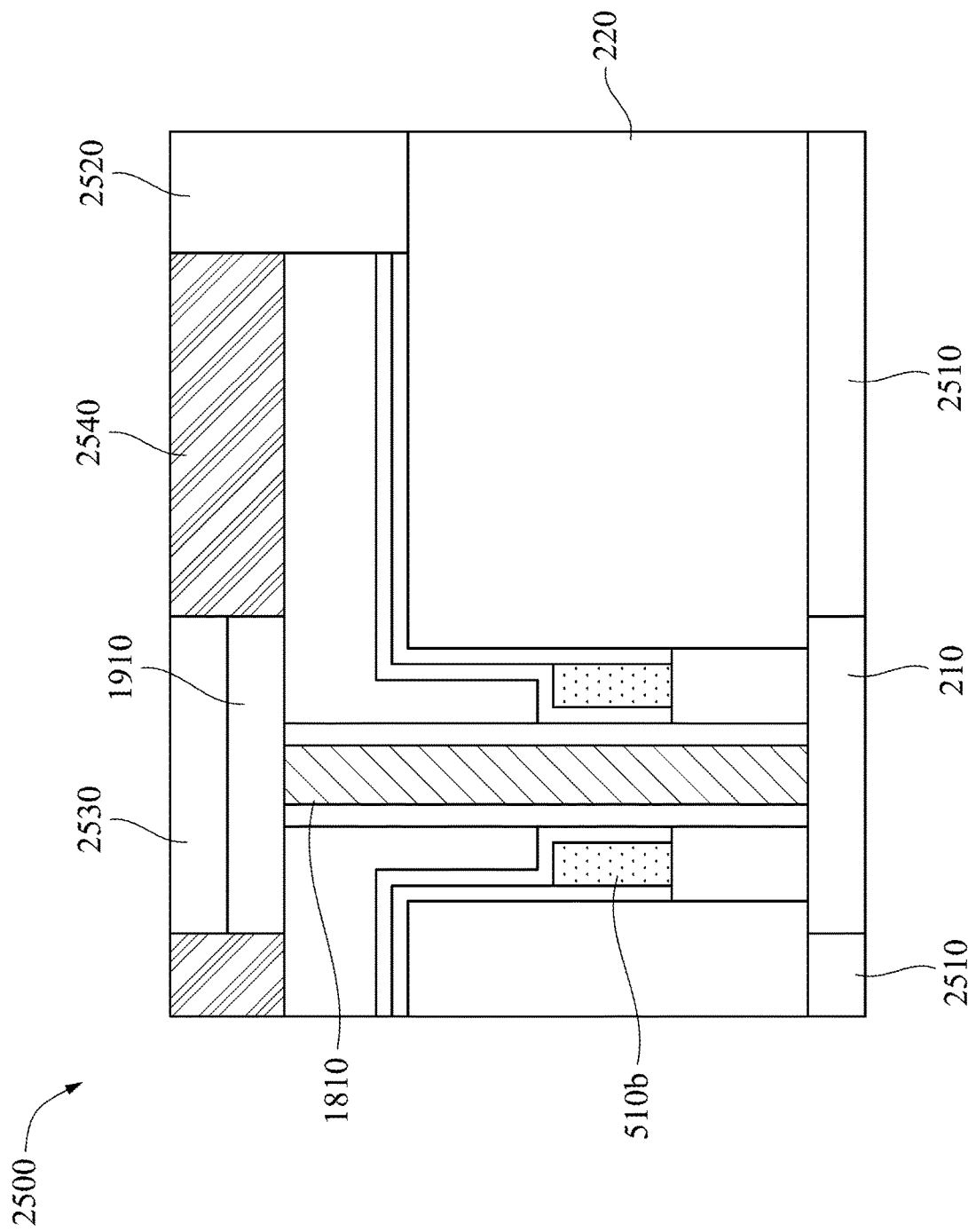
FIG. 25 is a cross-sectional view of a semiconductor device in accordance with some embodiments of the present disclosure.
Figure 26:
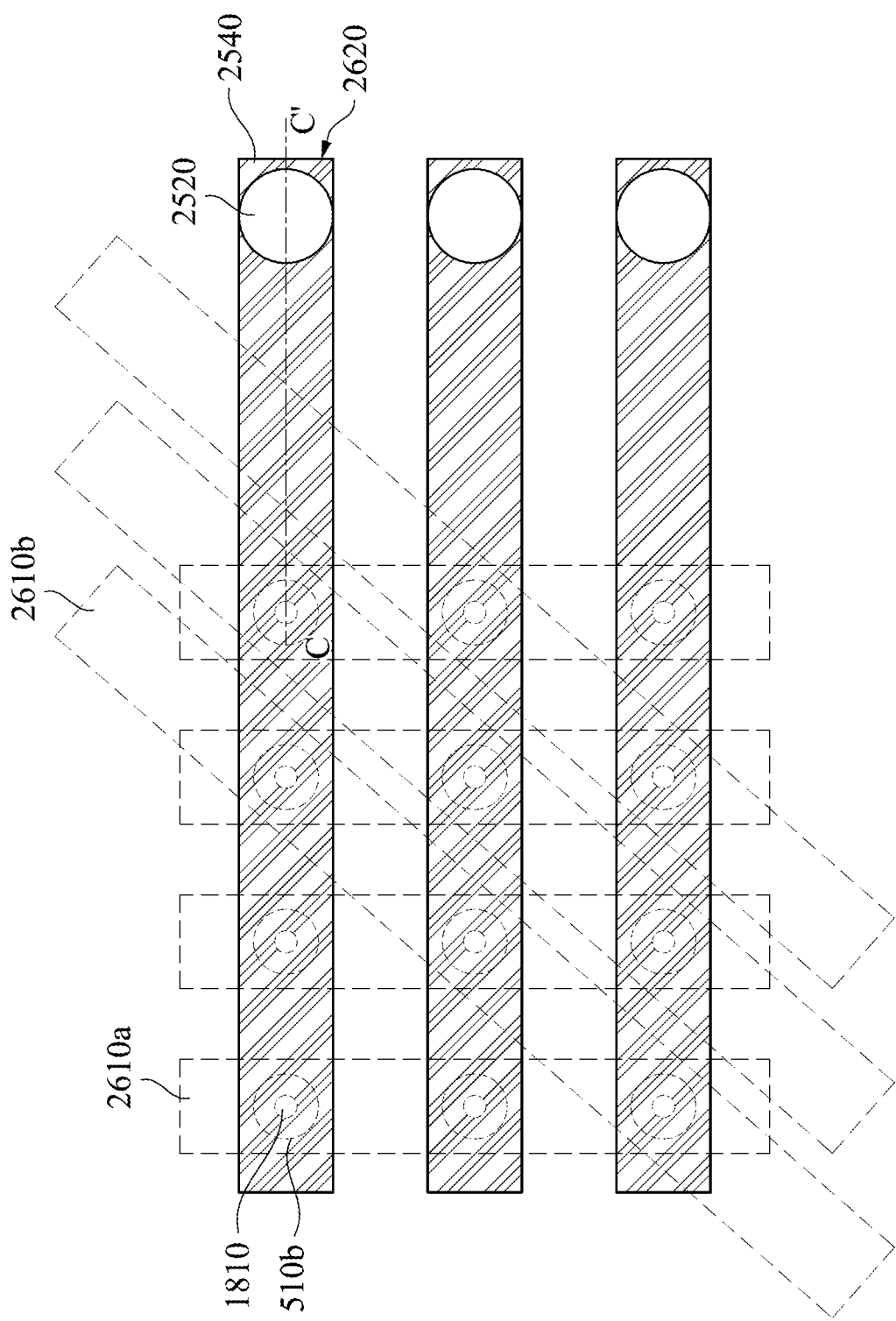
FIG. 26 is a top view of a semiconductor device in accordance with some embodiments of the present disclosure.

Please refer to FIG. 11, a conductive layer 1111 is formed to cover the sidewall 512 and the upper surface 516 of the patterned gate electrode 510a and the patterned seed layer 310a and to form a hole 1120. Specifically, the conductive layer 1111 covers the sidewall 318 and the upper surface 312 of the patterned seed layer 310a. In some embodiments, a lower surface 1112 of the conductive layer 1111 is substantially coplanar with the lower surface 514 of the patterned gate electrode 510b and/or the lower surface 316 of the patterned seed layer 310a. In some embodiments, the conductive layer 1111 includes conductive material, such as titanium (Ti), copper (Cu), tantalum (Ta), or combinations thereof, but not limited thereto. In some embodiments, the conductive layer 1111 is formed by a plating deposition. The thickness of the conductive layer 1111 can be adjusted by a plating time. It is understood that the material of the seed layer 310 (or the patterned seed layer 310a) and the gate electrode 510 (or the patterned gate electrode 510a) are conductive material; therefore, the conductive layer 1111 can be plated on the seed layer 310 and the gate electrode 510. A stack of the conductive layer 1111 and the patterned seed layer 310a acts as a voltage line. The total thickness of the conductive layer 1111 and the patterned seed layer 310a above the patterned gate electrode 510a is thick enough, thereby securing the voltage line (electrically connected to a contact 2520, which is shown in FIG. 25 and FIG. 26) can be functionally worked. The contact 2520 can be electrically connected to a voltage source.

Figure 12:
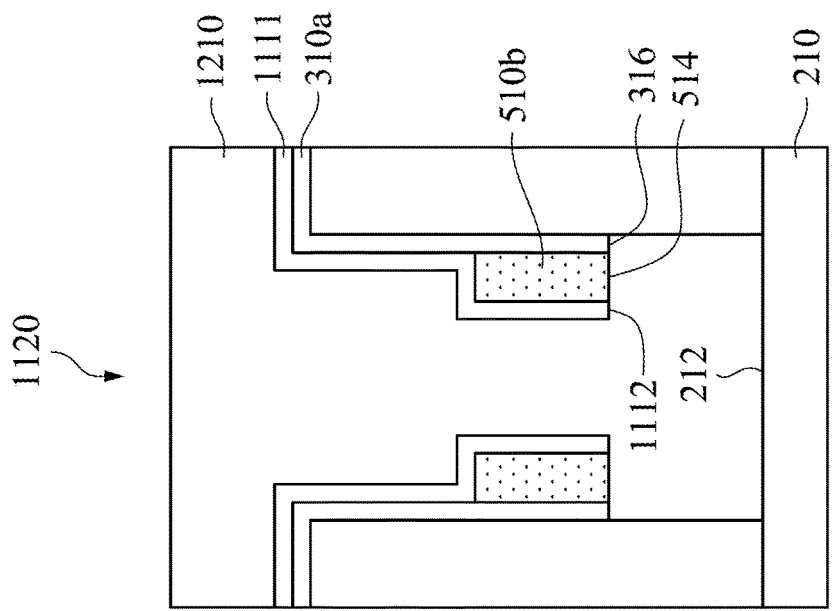

Please refer to FIG. 12, a gate dielectric layer 1210 is filled into the hole 1120. Specifically, the conductive layer 1111, the lower surface 514 of the patterned gate electrode 510b, the lower surface 316 of the patterned seed layer 310a, the bottom portion of the dielectric layer 220, and the upper surface 212 of the source/drain layer 210 are covered by the gate dielectric layer 1210. In some embodiments, the gate dielectric layer 1210 is formed by a deposition method such as chemical vapor deposition (CVD), physical vapor deposition (PVD), atomic layer deposition (ALD), or other suitable deposition processes. In some embodiments, the gate dielectric layer 1210 includes dielectric material such as silicon oxide.

Figure 13:
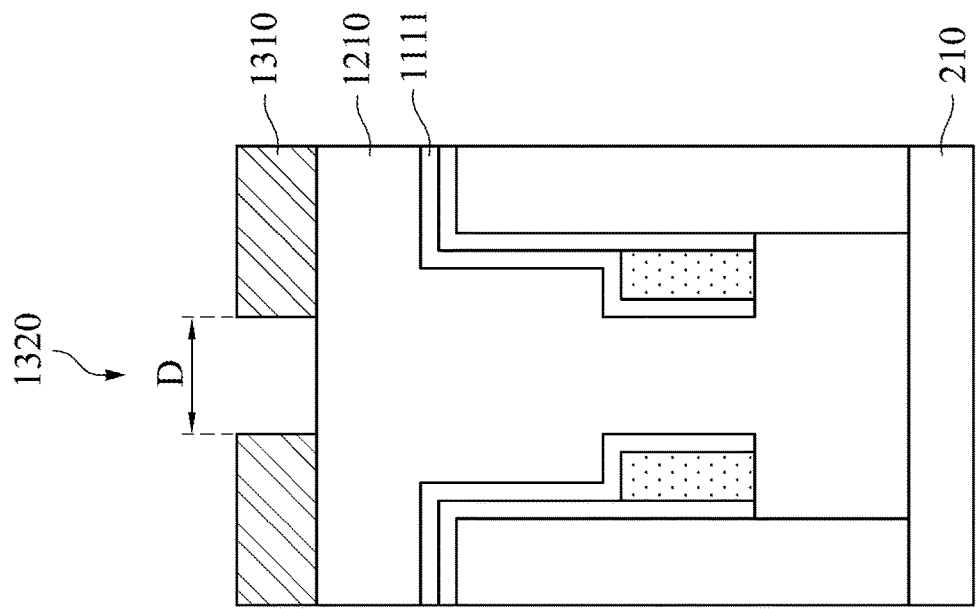
Figure 21:
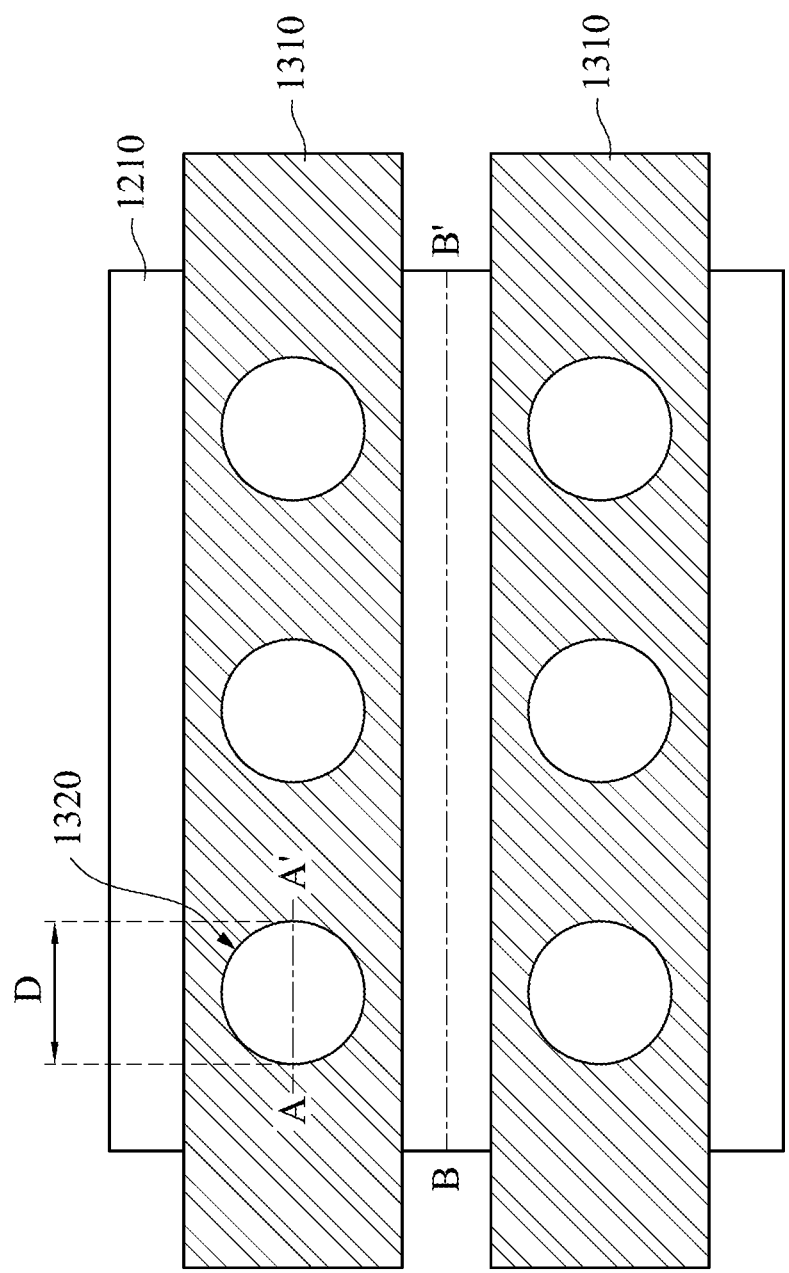
FIG. 21 is a top view of a semiconductor device in accordance with some embodiments of the present disclosure.

Please refer to FIG. 13 and FIG. 21. As shown in FIG. 13, a patterned photoresist layer 1310 is formed on the gate dielectric layer 1210. FIG. 21 is a top view of a semiconductor device in accordance with some embodiments of the present disclosure. FIG. 13 is a cross-sectional view of FIG. 21 taken along line A-A'. The patterned photoresist layer 1310 includes a hole 1320 having a diameter D. In some embodiments, the diameter D is in a range between about 40 nm and about 60 nm, for example, 42, 44, 46, 48, 50, 52, 54, 56, or 58 nm. In some embodiments, the patterned photoresist layer 1310 is formed by any suitable photoresist material.

Figure 14:
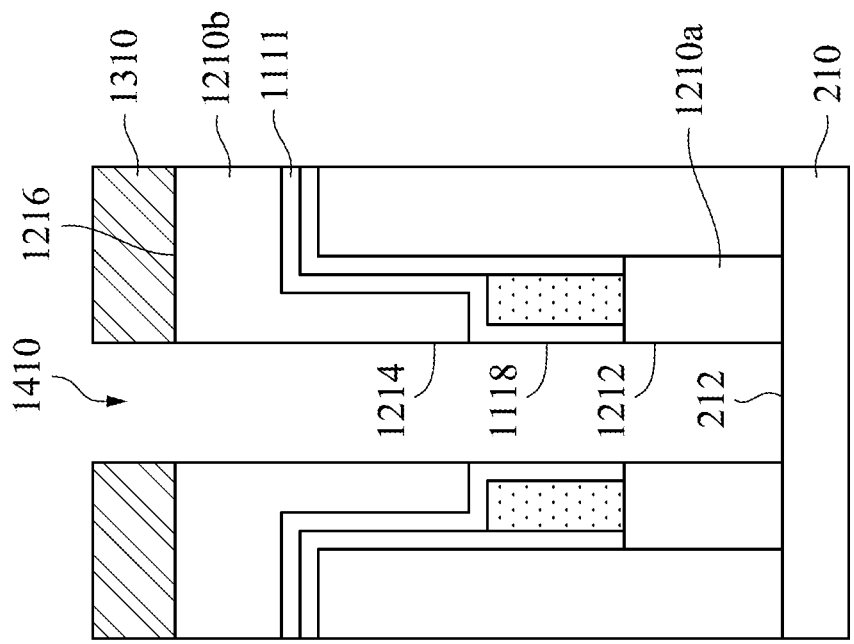

Please refer to FIG. 14, a portion of the gate dielectric layer 1210 is etched to form a hole 1410 to expose the source/drain layer 210 and a portion 1118 of the conductive layer 1111, in which the hole 1410 is substantially perpendicular to the upper surface 212 of the source/drain layer 210. It is to be understood that the hole 1410 will be filled with a channel in subsequent operations. Specifically, the portion of the gate dielectric layer 1210 is removed according to the patterned photoresist layer 1310 to form a gate dielectric layer 1210a and a gate dielectric layer 1210b. A sidewall 1212 of the gate dielectric layer 1210a and a sidewall 1214 of the gate dielectric layer 1210b are exposed from the hole 1410. The patterned photoresist layer 1310 is removed after the hole 1410 is formed, and an upper surface 1216 of the gate dielectric layer 1210b is exposed. It is understood that the sidewall 1212 of the gate dielectric layer 1210a, the sidewall 1214 of the gate dielectric layer 1210b, and the portion 1118 of the conductive layer 1111 are substantially coplanar. In some embodiments, the portion of the gate dielectric layer 1210 is etched by a dry etching process.

Figure 15:
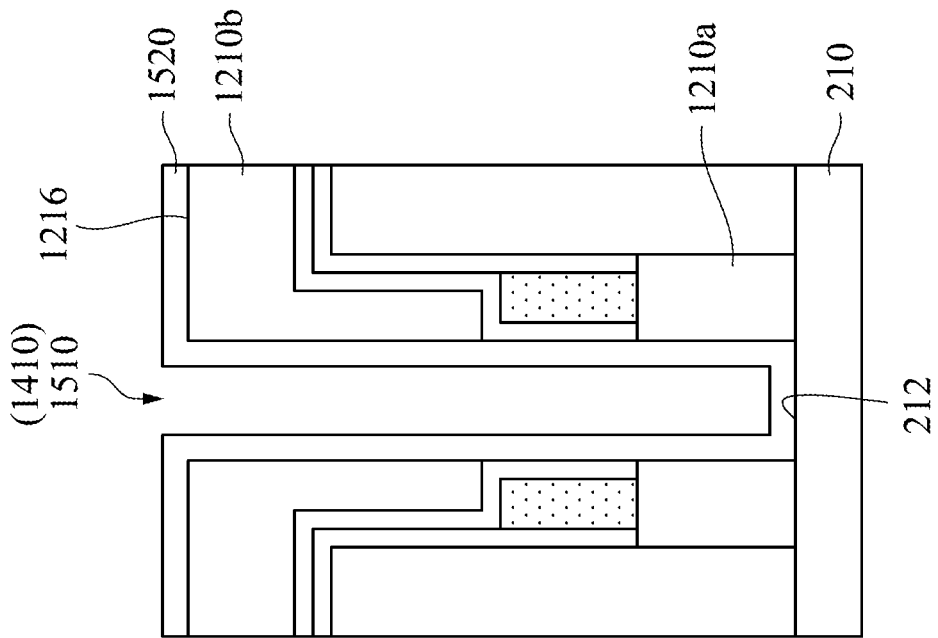
Figure 16:
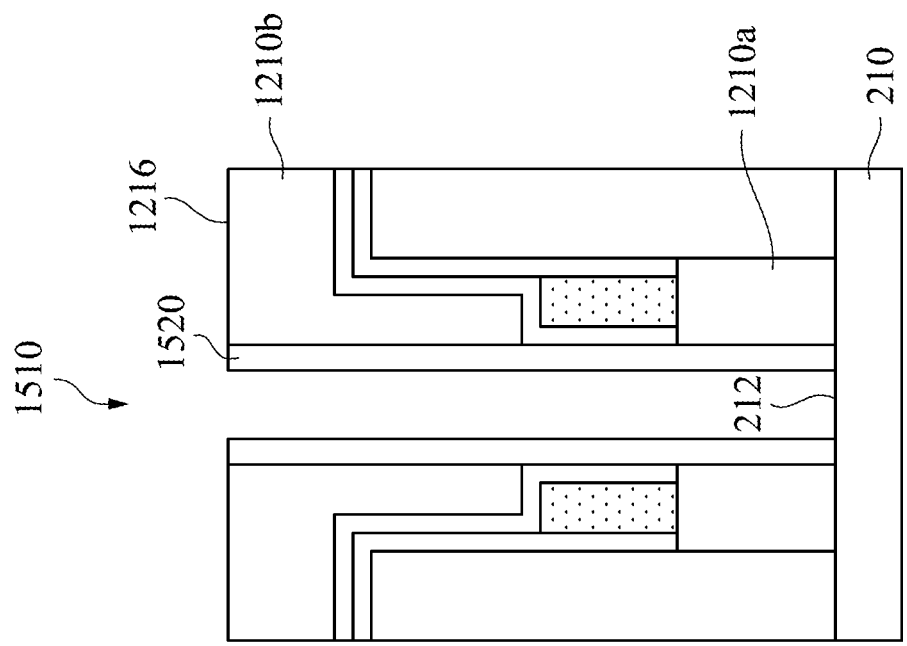

Please refer to FIG. 15 and FIG. 16, a gate dielectric layer 1510 is formed to cover the sidewall of the hole 1410 and to form a hole 1510. Specifically, the gate dielectric layer 1520 is formed on the sidewall of the hole 1410, the upper surface 212 of the source/drain layer 210, and the upper surface 1216 of the gate dielectric layer 1210b, as shown in FIG. 15. Subsequently, portions of the gate dielectric layer 1520 are removed to expose the upper surface 212 of the source/drain layer 210 and the upper surface 1216 of the gate dielectric layer 1210b, as shown in FIG. 16. In some embodiments, the gate dielectric layer 1520 includes dielectric material such as silicon oxide. In some embodiments, the portions of the gate dielectric layer 1520 are removed by an etch back operation.

Figure 17:
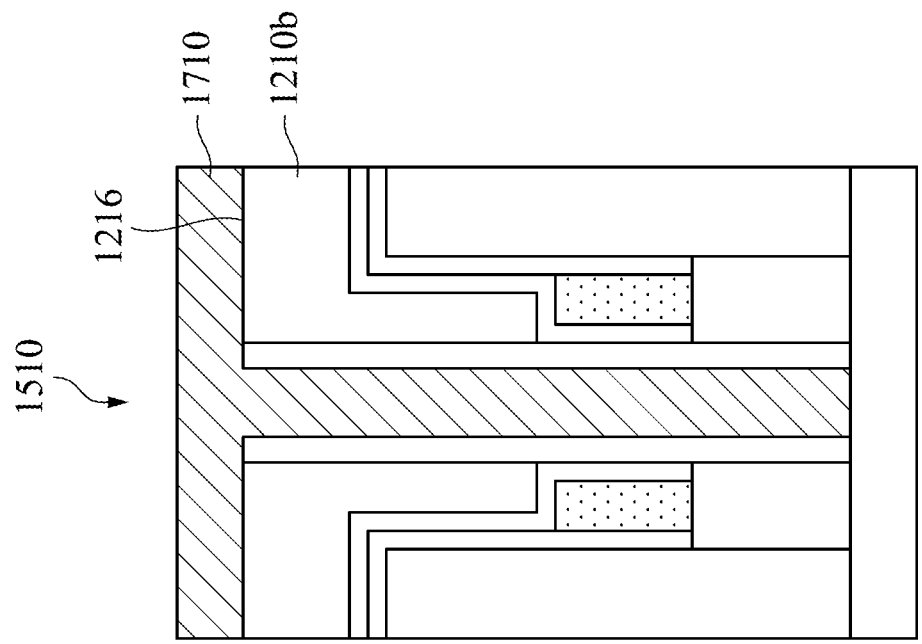

Please refer to FIG. 17, a channel material 1710 is formed in the hole 1510 and covers the upper surface 1216 of the gate dielectric layer 1210b, as shown in FIG. 17. In some embodiments, the channel material 1710 includes indium tin oxide (ITO), indium zinc oxide (IZO) or indium gallium zinc oxide (IGZO), but not limited thereto. In some embodiments, the channel material 1710 is formed by a deposition method such as chemical vapor deposition (CVD), physical vapor deposition (PVD), atomic layer deposition (ALD), or other suitable deposition processes.

Figure 18:
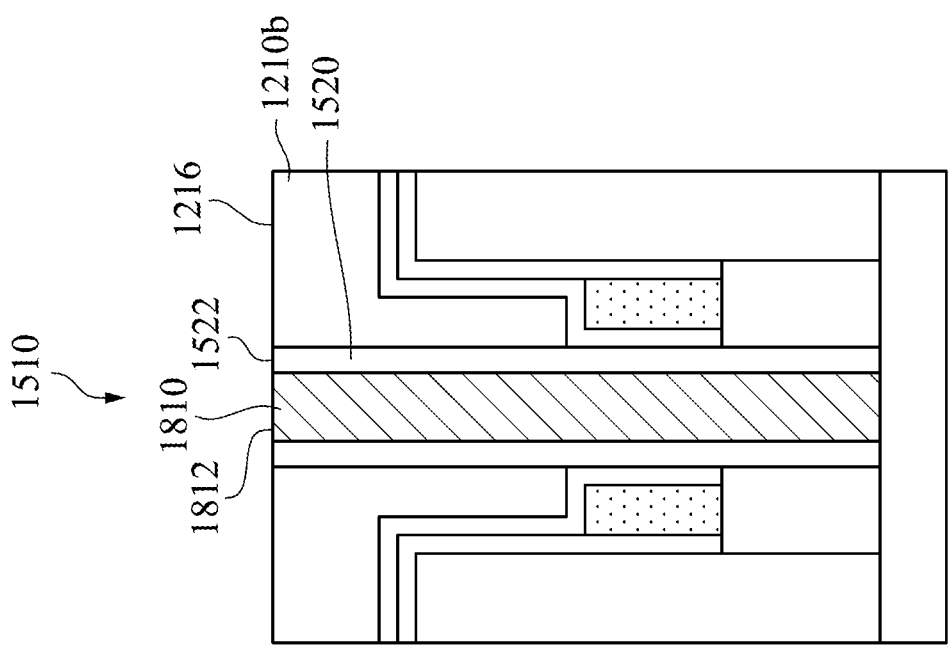

Please refer to FIG. 18, a channel 1810 is formed in the hole 1510. Specifically, the channel material 1710 above the gate dielectric layer 1210b is removed to expose the upper surface 1216 of the gate dielectric layer 1210b, as shown in FIG. 18. In some embodiments, a portion of the channel material 1710 is removed by a planarization operation, such as chemical mechanical polishing (CMP). In some embodiments, an upper surface 1812 of the channel 1810, the upper surface 1522 of the gate dielectric layer 1520, and the upper surface 1216 of the gate dielectric layer 1210b are substantially coplanar with each other.

Figure 19:
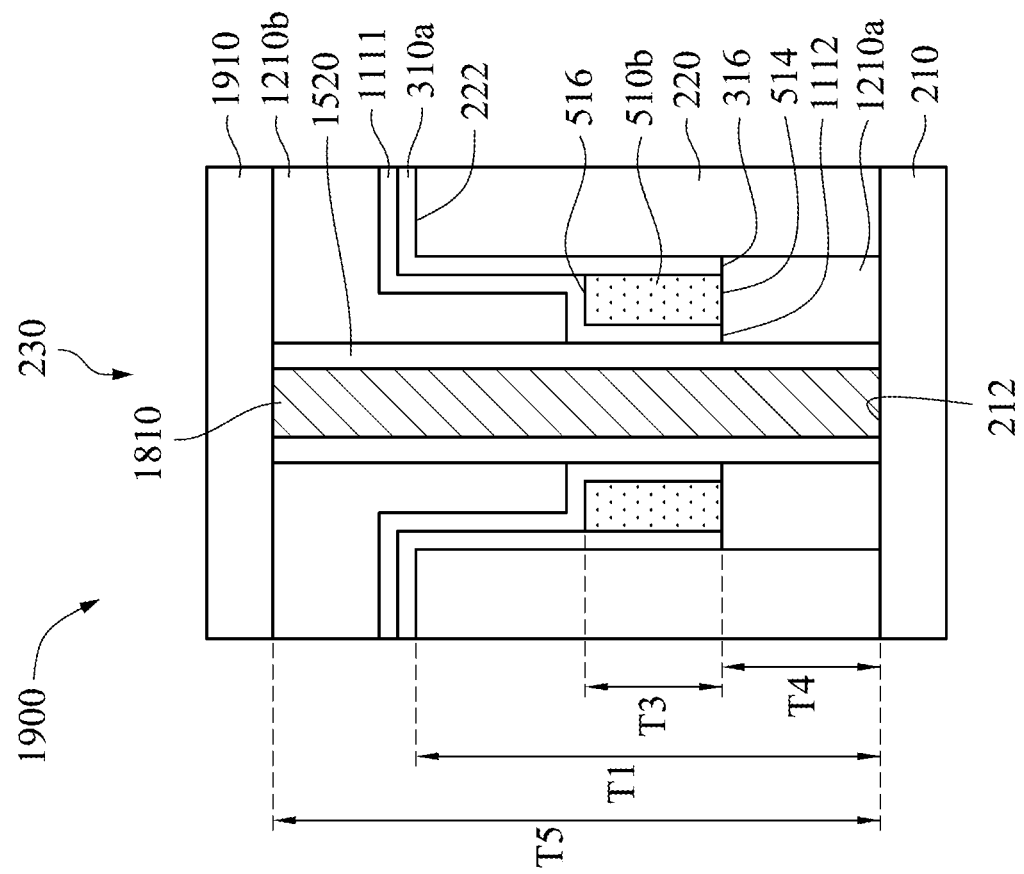

Please refer to FIG. 19, a source/drain layer 1910 is formed on the channel 1810 to form the semiconductor device 1900. In some embodiments, a material of the source/drain layer 1910 can be the same with that of the source/drain layer 210.

Figure 22:
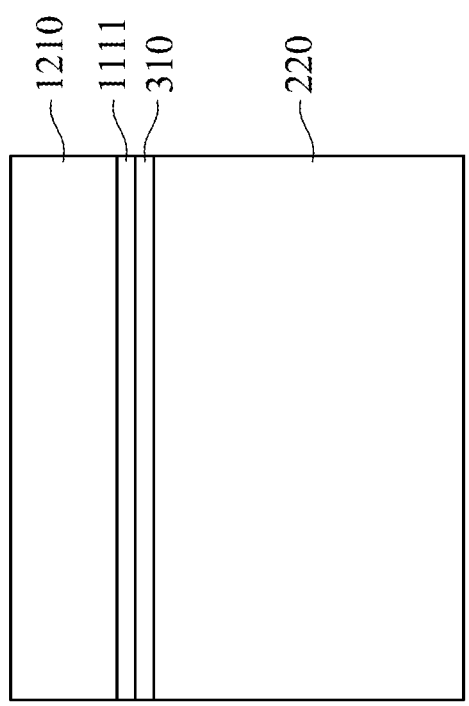

FIG. 22 to FIG. 24 are cross-sectional views of schematically illustrating intermediate stages in the manufacturing of the semiconductor device 1900 in accordance with some embodiments of the present disclosure. In detail, FIG. 22 to FIG. 24 illustrates cross-sectional views of a region except for the channel 1810 and the gate electrode 510b.

FIG. 22 is a cross-sectional view of FIG. 21 taken along line B-B'. Specifically, the seed layer 310, the conductive layer 1111, and the gate dielectric layer 1210 are formed on the dielectric layer 220, respectively, as shown in FIG. 22. The formations of the seed layer 310, the conductive layer 1111, and the gate dielectric layer 1210 are the same with the description as mentioned above (FIG. 3, FIG. 11, and FIG. 12), and the details thereof are not repeatedly described.

Please refer to FIG. 23, the gate dielectric layer 1210 is removed according to the patterned photoresist layer 1310 as shown in FIG. 21. Please refer to FIG. 24, the conductive layer 1111 and the seed layer 310 are removed to expose the dielectric layer 220. Specifically, the conductive layer 1111 and the seed layer 310 in FIG. 23 are removed before forming the gate dielectric layer 1520 as shown in FIG. 15.

In some embodiments, the conductive layer 1111 and the seed layer 310 can be removed by at least two different wet etching processes.

Please refer to FIG. 19 again. The semiconductor device 1900 includes the source/drain layer 210, the dielectric layer 220, the channel 1810, the gate electrode 510b, the gate dielectric layer 1520, the seed layer 310a, the conductive layer 1111, and the source/drain layer 1910. The dielectric layer 220 is disposed on the source/drain layer 210, in which the dielectric layer 220 has the hole 230 penetrating the dielectric layer 220. The channel 1810 is disposed in the hole 230 and extends substantially perpendicular to the upper surface 212 of the source/drain layer 210. The gate electrode 510b surrounds the channel 1810. The gate dielectric layer 1520 is disposed between the gate electrode 510b and the channel 1810. The seed layer 310a is disposed between the gate electrode 510b and the dielectric layer 220 and on the upper surface 222 of the dielectric layer 220, in which the seed layer 310a covers a portion of a sidewall of the hole 230. The conductive layer 1111 is disposed between the gate electrode 510b and the gate dielectric layer 1520, and on the upper surface 516 of the gate electrode 510b and the seed layer 310a. The source/drain layer 1910 disposed on the channel 1810.

In some embodiments, the lower surface 514 of the gate electrode 510b is substantially coplanar with the lower surface 316 of the seed layer 310a. In some embodiments, the lower surface 514 of the gate electrode 510b is substantially coplanar with the lower surface 1112 of the conductive layer 1111. In some embodiments, a material of the gate electrode 510b is the same as a material of the conductive layer 1111. In some embodiments, a material of the gate electrode 510b is different from a material of the seed layer 310a. In some embodiments, a material of the conductive layer 1111 is different from a material of the seed layer 310a.

In some embodiments, the gate dielectric layer 1210a is disposed between the gate electrode 510b and the source/drain layer 210, in which a thickness T4 of the gate dielectric layer 1210a is smaller than the thickness T3 of the gate electrode 510b. In some embodiments, the gate dielectric layer 1210b is disposed between the source/drain layer 1910 and the conductive layer 1111, and between the gate dielectric layer 1520 and the conductive layer 1111. In some embodiments, a thickness T5 of the channel 1810 is greater than the thickness T1 of the dielectric layer 220. In some embodiments, a vertical distance between the upper surface 516 of the gate electrode 510b and the upper surface 222 of the dielectric layer 220 is smaller than the thickness T3 of the gate electrode 510b. In some embodiments, a ratio of the thickness T1 of the dielectric layer 220 to thickness T4 of the gate dielectric layer 1210a is in a range between about 5:0.5 and about 5:1.5, for example, 5:0.8, 5:1, 5:1.2, or 5:1.4. In some embodiments, a ratio of the thickness T1 of the dielectric layer 220 to the thickness T3 of the gate electrode 510b is in a range between about 5:2 and about 5:4, for example, 5:2.5, 5:3, or 5:3.5.

Please refer to FIG. 25. FIG. 25 is a cross-sectional view of a semiconductor device 2500 in accordance with some embodiments of the present disclosure. In some embodiments, the semiconductor device 2500 further includes an isolation layer 2510 disposed around the source/drain layer 210 to isolate other source/drain layers (not shown). In some embodiments, the isolation layer 2510 is formed by nitride, but not limited thereto. In some embodiments, the semiconductor device 2500 further includes a contact 2520, which can also refer to as a gate pick-up, to electrically connect to the gate electrode 510b through the stack of the conductive layer 1111 and the patterned seed layer 310a. In some embodiments, a material of the contact 2520 can be includes conductive material, such as tungsten (W), copper (Cu), or molybdenum (Mo), but not limited thereto. In some embodiments, the semiconductor device 2500 further includes a contact 2530 disposed on the source/drain layer 1910. In some embodiments, the contact 2520 and/or the contact 2530 are formed by a plating deposition. In some embodiments, the semiconductor device 2500 further includes a dielectric layer 2540 disposed around the source/drain layer 1910, the contact 2530, and the contact 2520. The stack of the conductive layer 1111 and the patterned seed layer 310a acts as a voltage line. The total thickness of the conductive layer 1111 and the patterned seed layer 310a above the patterned gate electrode 510a is thick enough, thereby securing the voltage line (electrically connected to the contact 2520) can work well. The contact 2520 can be electrically connected to a voltage source.

Please refer to FIG. 26. FIG. 26 is a top view of the semiconductor device 2500 at a stage in accordance with some embodiments of the present disclosure. Specifically, FIG. 26 illustrates a memory array 2600 of a semiconductor device 2500. The memory array 2600 includes the gate electrode 510b, a word line 2620, and one of the a bit line 2610a and a bit line 2610b. It is noticed that some elements of FIG. 25 are not illustrated in FIG. 26 for clarity, and some elements of FIG. 26 are not illustrated in FIG. 25 for clarity. It should be understood that, after the seed layer 310 as shown in FIG. 24 is removed and the patterned photoresist layer 1310 as shown in FIG. 21, the word line 2620 is formed. In other words, the word line 2620 has a pattern similar to the patterned photoresist layer 1310. The bit line 2610a or the bit line 2610b is disposed over the gate electrode 510b and the word line 2620. In some embodiments, the dielectric layer 2540 extends along a direction D1 and the bit line 2610a extends along a direction D2 substantially vertical to the direction D1. In some embodiments, the dielectric layer 2540 extends along a direction D1 and the bit line 2610b extends along a direction D3, in which an angle θ between the direction D1 and the direction D3 is less than 90 degree.

Please refer to FIG. 25 and FIG. 26 at the same time. In some embodiments, the semiconductor device 2500 further includes the bit line 2610a and a bit line 2610b disposed on and electrically connected to the contact 2530.

The present disclosure of the manufacturing method of the memory array 2600 is firstly forming the gate electrode 510b, followed by forming the word line 2620, and then forming the bit line 2610a (or the bit line 2610b). Therefore, comparing to a traditional manufacturing method, the number of times of photolithography process can be reduced and then the alignment problem can be avoided, thereby reducing the possibility of short circuits of the RAM and forming the RAM with a smaller pitch. This has a positive impact on RAM to the next generation. In addition, the gate electrode is formed by a plating deposition, and so the thickness of the gate electrode can be adjusted by a plating time. Furthermore, due to the formation of the seed layer, the conductive layer can be formed by a plating deposition, and the deposition of the conductive layer can increase the thickness of the seed layer, thereby securing the voltage line (electrically connected to the contact) can be functionally worked.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first source/drain layer;
    a dielectric layer disposed on the first source/drain layer, wherein the dielectric layer has a hole penetrating the dielectric layer;
    a channel disposed in the hole and extending substantially perpendicular to an upper surface of the first source/drain layer;
    a gate electrode surrounding the channel;
    a first gate dielectric layer disposed between the gate electrode and the channel;
    a seed layer disposed between the gate electrode and the dielectric layer and on an upper surface of the dielectric layer, wherein the seed layer covers a portion of a sidewall of the hole;
    a conductive layer disposed between the gate electrode and the first gate dielectric layer, and on an upper surface of the gate electrode and the seed layer; and
    a second source/drain layer disposed on the channel.

2. The semiconductor device of claim 1, wherein a lower surface of the gate electrode is substantially coplanar with a lower surface of the seed layer.

3. The semiconductor device of claim 1, wherein a lower surface of the gate electrode is substantially coplanar with a lower surface of the conductive layer.

4. The semiconductor device of claim 1, wherein a material of the gate electrode is the same as a material of the conductive layer.

5. The semiconductor device of claim 1, wherein a material of the gate electrode is different from a material of the seed layer.

6. The semiconductor device of claim 1, wherein a material of the conductive layer is different from a material of the seed layer.

7. The semiconductor device of claim 1, further comprising a second gate dielectric layer disposed between the gate electrode and the first source/drain layer, wherein a first thickness of the second gate dielectric layer is smaller than a second thickness of the gate electrode.

8. The semiconductor device of claim 1, wherein the dielectric layer has a first thickness, the gate electrode has a second thickness, and a ratio of the first thickness to the second thickness is in a range between 5:2 and 5:4.

9. The semiconductor device of claim 1, further comprising a third gate dielectric layer disposed between the second source/drain layer and the conductive layer, and between the first gate dielectric layer and the conductive layer.

10. The semiconductor device of claim 1, wherein a first thickness of the channel is greater than a second thickness of the dielectric layer.

11. The semiconductor device of claim 1, wherein the gate electrode has a first thickness, and a vertical distance between the upper surface of the gate electrode and the upper surface of the dielectric layer is smaller than the first thickness.

* * * * *